United States Patent
Matsumura et al.

(10) Patent No.: US 9,817,024 B2
(45) Date of Patent: Nov. 14, 2017

(54) TEST CARRIER FOR MOUNTING AND TESTING AN ELECTRONIC DEVICE

(71) Applicant: ADVANTEST CORPORATION, Tokyo (JP)

(72) Inventors: Hidenobu Matsumura, Tokyo (JP); Noriyuki Masuda, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 124 days.

(21) Appl. No.: 14/736,843

(22) Filed: Jun. 11, 2015

(65) Prior Publication Data

US 2016/0003869 A1   Jan. 7, 2016

(30) Foreign Application Priority Data

Jul. 3, 2014 (JP) ................................ 2014-137364

(51) Int. Cl.
*G01R 1/04* (2006.01)
*G01R 31/28* (2006.01)

(52) U.S. Cl.
CPC ....... *G01R 1/0416* (2013.01); *G01R 31/2889* (2013.01)

(58) Field of Classification Search
CPC .... G01R 31/26; G01R 31/00; G01R 31/2893; G01R 1/0408; G01R 1/0483; G01R 1/0416
See application file for complete search history.

(56) References Cited

U.S. PATENT DOCUMENTS

| | | |
|---|---|---|
| 2009/0027073 A1 | 1/2009 | Nishiura |
| 2009/0033337 A1 | 2/2009 | Pasco |
| 2009/0314607 A1 | 12/2009 | Karino et al. |
| 2011/0089968 A1 | 4/2011 | Kogure et al. |
| 2012/0235699 A1 | 9/2012 | Nakamura et al. |
| 2012/0268157 A1* | 10/2012 | Kogure ................ G01R 1/0408 324/756.07 |
| 2013/0120014 A1 | 5/2013 | Nakamura et al. |
| 2013/0120015 A1* | 5/2013 | Nakamura ........... G01R 1/0491 324/756.02 |
| 2014/0179031 A1* | 6/2014 | Preston .............. G01R 31/2886 438/15 |

FOREIGN PATENT DOCUMENTS

| | | |
|---|---|---|
| JP | 7-20193 | 1/1995 |
| JP | 2013-104834 | 5/2013 |

(Continued)

OTHER PUBLICATIONS

Official Action, along with English-language translation thereof, for TW Appl. No. 104116189 dated May 18, 2016.

(Continued)

*Primary Examiner* — Alesa Allgood
(74) *Attorney, Agent, or Firm* — Greenblum & Bernstein, P.L.C.

(57) ABSTRACT

A test carrier includes a base member on which a first electronic device under test is able to be temporarily mounted, and a second electronic device which is configured to be used to test the first electronic device. The second electronic device is mounted on the base member, and the second electronic device is able to be electrically connected to the first electronic device.

6 Claims, 9 Drawing Sheets

(56) References Cited

FOREIGN PATENT DOCUMENTS

| | | |
|---|---|---|
| TW | 200817261 | 4/2008 |
| TW | 200820367 | 5/2008 |
| TW | 201329466 | 7/2013 |
| WO | 2004/064151 | 7/2004 |
| WO | 2011/048834 | 4/2011 |

OTHER PUBLICATIONS

Official Action for South Korean Patent Appl. No. 10-2015-0080407 dated May 20, 2016.

* cited by examiner

TEST CARRIER FOR MOUNTING AND TESTING AN ELECTRONIC DEVICE

TECHNICAL FIELD

The present invention relates to a test carrier on which a die is able to be temporarily mounted for testing an electronic circuit such as an integrated circuit formed in the die.

The present application claims priority from Japanese Patent Application No. 2014-137364 filed on Jul. 3, 2014. The contents described and/or illustrated in the documents relevant to the Japanese Patent Application No. 2014-137364 will be incorporated herein by reference as a part of the description and/or drawings of the present application.

BACKGROUND ART

There is a known test carrier which holds a die between a base member and a cover member by interposing the die between the base member and the cover member in a decompressed state and restoring an atmospheric pressure in this state (for example, see Patent document 1).

In the test carrier, an electrode of the die is electrically connected to an external terminal through a wiring pattern provided in the base member, and a testing device tests an electronic circuit formed in the die through the external terminal.

CITATION LIST

Patent Document

Patent Document 1: JP 2013-104834 A

DISCLOSURE OF THE INVENTION

Problem to be Solved by the Invention

When an electronic device under test (DUT) is a logic device such as a central processing unit (CPU) or a micro processing unit (MPU), the DUT may be connected to a memory device such as a dynamic random access memory (DRAM) and tested in a state similar to an actual operation in a final testing process after packaging a die (bare chip).

The DUT needs to be tested in the state similar to the actual operation even when a memory chip is directly mounted on a logic chip using a three-dimensional mounting technology. Moreover, this device having a three-dimensional mounting structure is expensive. Therefore, it is required to verify an operation of the logic chip at a bare chip level before the memory chip is mounted on the logic chip.

However, a test using the above-described test carrier has a problem in that the memory chip cannot be disposed close to the logic chip similarly to an actual operation and it is difficult to ensure a high-quality test.

An object to be solved by the invention is to provide a test carrier capable of improving quality of a test of an electronic device under test in a similar state to an actual operation.

Means for Solving Problem

[1] A test carrier according to the invention includes: a base member on which a first electronic device under test is able to be temporarily mounted; and a second electronic device for testing which is configured to be used to test the first electronic device, wherein the second electronic device is mounted on the base member, and the second electronic device is able to be electrically connected to the first electronic device.

[2] According to the invention, the base member may include: a first external terminal of the test carrier; a first wiring which is able to electrically connect the first electronic device to the first external terminal, and a second wiring which is able to electrically connect the first electronic device to the second electronic device.

[3] According to the invention, the base member may include: an interposer on which the second electronic device is mounted; and a wiring substrate on which the first external terminal is provided and which holds the interposer, the interposer may include: a first main surface on which first and second internal terminals are provided, the first and second internal terminals being able to be in contact with first and second electrodes of the first electronic device; and a second main surface on which a third internal terminal is provided, the third internal terminal being joined to a third electrode of the second electronic device, the first wiring may be provided in the interposer and the wiring substrate so as to electrically connect the first internal terminal to the first external terminal, and the second wiring may be provided in the interposer so as to electrically connect the second internal terminal to the third internal terminal.

[4] According to the invention, the wiring substrate may include: a first wiring substrate which includes a first opening; and a second wiring substrate on which the first wiring substrate is stacked, the interposer and the second electronic device may be interposed between the first wiring substrate and the second wiring substrate, and the first and second internal terminals of the interposer may able to face the first electronic device through the first opening.

[5] According to the invention, the first electronic device may include a logic integrated circuit, and the second electronic device may include a memory integrated circuit.

[6] According to the invention, the first electronic device may include a logic integrated circuit, and the second electronic device may include: a memory integrated circuit; and a recorder which is configured to record communication between the first electronic device and the memory integrated circuit.

[7] According to the invention, the first electronic device may include a logic integrated circuit, and the second electronic device may include a circuit for testing which is configured to be used to test the electronic device under test.

[8] According to the invention, the base member may include: a second external terminal of the test carrier; and a third wiring which electrically connects the second electronic device to the second external terminal.

[9] According to the invention, the second main surface of the interposer may have a fourth internal terminal which is joined to a fourth electrode of the second electronic device, and the third wiring may be provided in the interposer and the wiring substrate so as to electrically connect the fourth internal terminal to the second external terminal.

[10] According to the invention, the test carrier may further include a cover member which is laid on the base member so as to cover the first electronic device, and the first electronic device may be interposed between the base member and the cover member of the test carrier.

[11] According to the invention, the cover member may include: a film which covers the first electronic device, and a frame which includes a second opening and to which the film is attached, an accommodation space may be formed between the base member and the cover member to accommodate the first electronic device, and the accommodation space may be decompressed in comparison with ambient air.

[12] According to the invention, the film may be made of a self-adhesive material.

[13] According to the invention, the first electronic device may be a die formed by dicing a semiconductor wafer.

Effect of the Invention

In the invention, the test carrier includes the second electronic device for testing is able to be electrically connected to the first electronic device. For this reason, it is possible to improve quality of a test of the first electronic device in a similar state to an actual operation.

MODE(S) FOR CARRYING OUT THE INVENTION

Hereinafter, embodiments of the invention will be described based on drawings.

Figure 1:
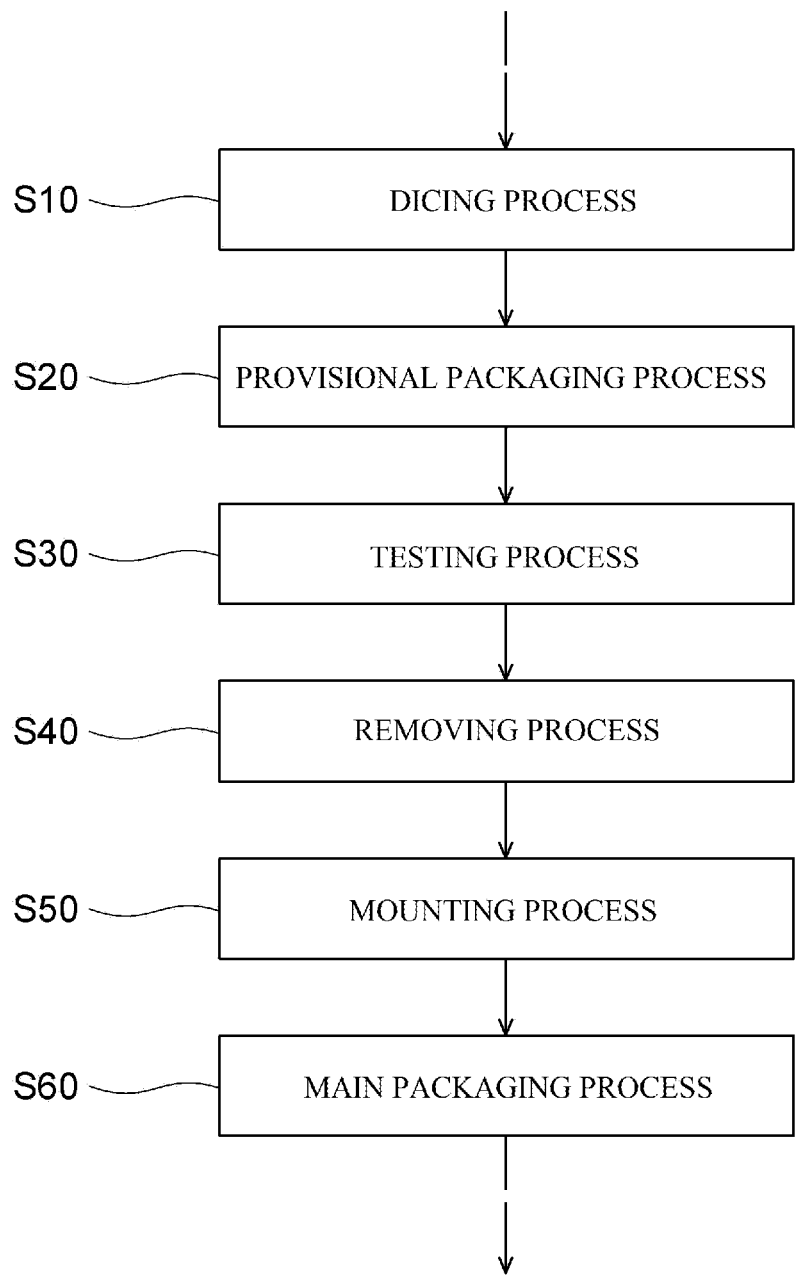
FIG. 1 is a flowchart illustrating a part of a process of manufacturing a device in a first embodiment of the invention.

FIG. 1 is a flowchart illustrating a part of a process of manufacturing a device in a first embodiment of the invention.

In the present embodiment, a device under test (DUT) 90 is tested using a test carrier 10 (steps S20 to S40) after dicing a semiconductor wafer (after step S10 of FIG. 1) and before three-dimensional mounting and final packaging (before steps S50 and S60).

The DUT 90 in the present embodiment is a die (bare chip) in which a logic large scale integration (LSI) is formed. Specifically, examples of the DUT 90 may include a bare chip of a processor such as a central processing unit (CPU) or a micro processing unit (MPU). The DUT 90 may be a system on chip (SoC) in which a memory LSI or the like is formed in addition to the logic LSI. The DUT 90 in the present embodiment corresponds to an example of a first electronic device under test in the invention, and the logic LSI in the present embodiment corresponds to an example of a logic integrated circuit in the invention.

As illustrated in FIG. 1, in the present embodiment, first, the DUT 90 is temporarily mounted in the test carrier 10 using a carrier assembling device (not illustrated) (step S20). Subsequently, the DUT 90 is tested by electrically connecting the DUT 90 to a testing device 1 (see FIG. 6) through the test carrier 10 (step S30). Then, when the test ends, the DUT 90 is removed from the test carrier 10 (step S40). Incidentally, the test carrier 10, from which the DUT 90 is removed, is reused to test another DUT 90.

Meanwhile, another die is directly mounted in the DUT 90, which is removed from the test carrier 10, using a three-dimensional mounting technology (step S50). Subsequently, a device is completed as a final product through a main packaging process for the DUT 90 (step S60). For example, the other die three-dimensionally mounted in the DUT 90 is a bare chip in which the memory LSI is formed. Specifically, examples of the other die may include a bare chip of a memory such as a dynamic random access memory (DRAM).

Hereinafter, a description will be given of a configuration of the test carrier 10 on which the DUT 90 is temporarily mounted (provisionally packaged) in the present embodiment with reference to FIGS. 2 to 4.

Figure 2:
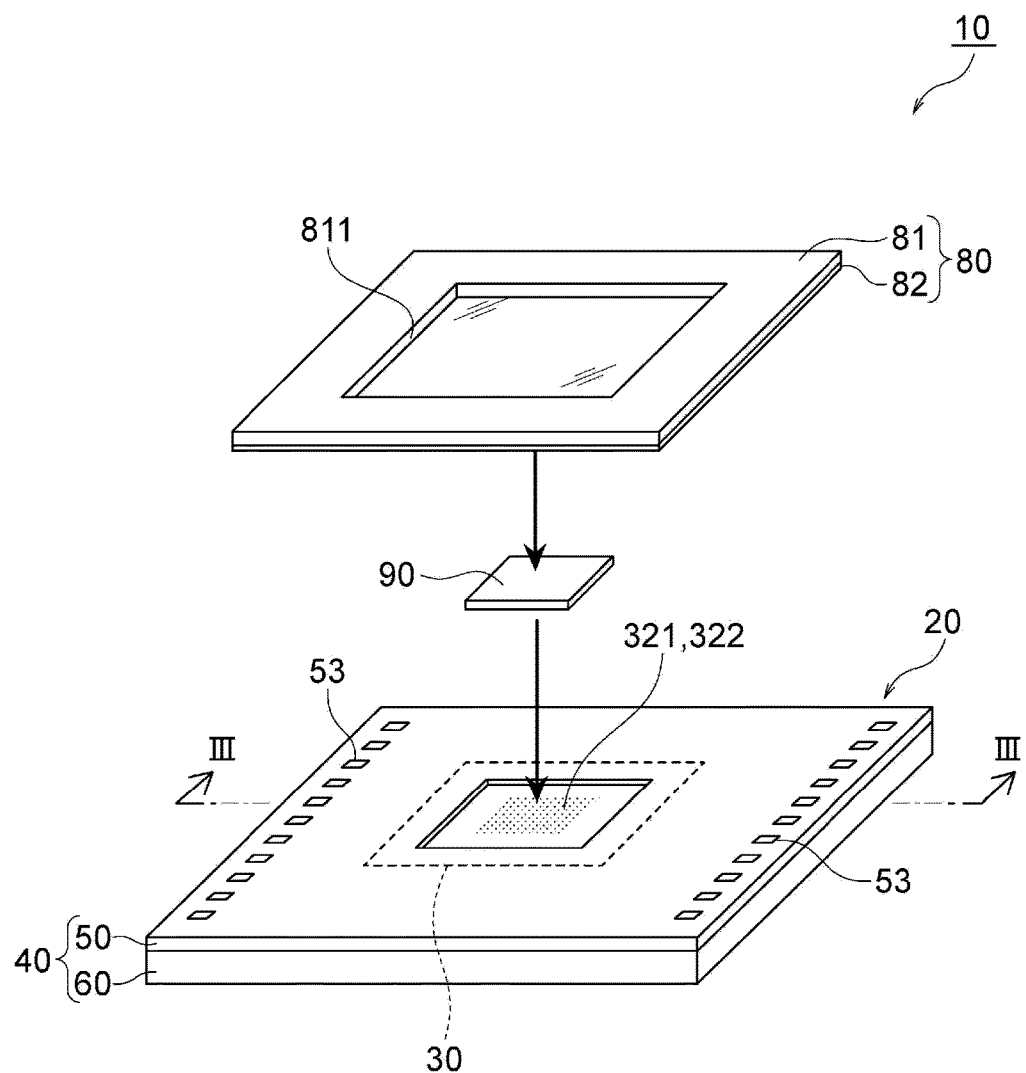
FIG. 2 is an exploded perspective view of a test carrier in the first embodiment of the invention.
Figure 3:
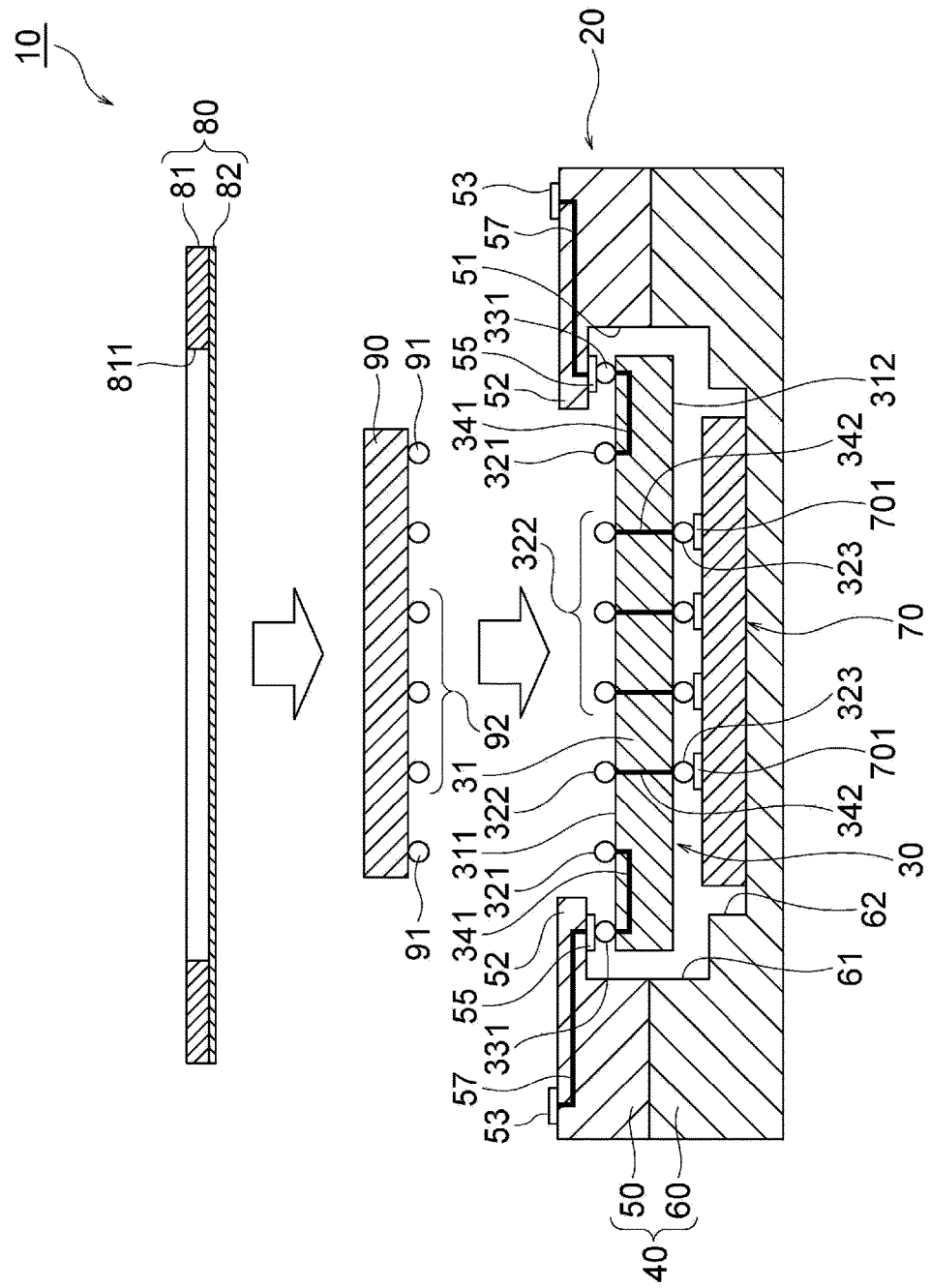
FIG. 3 is an exploded sectional view of the test carrier in the first embodiment of the invention.
Figure 4:
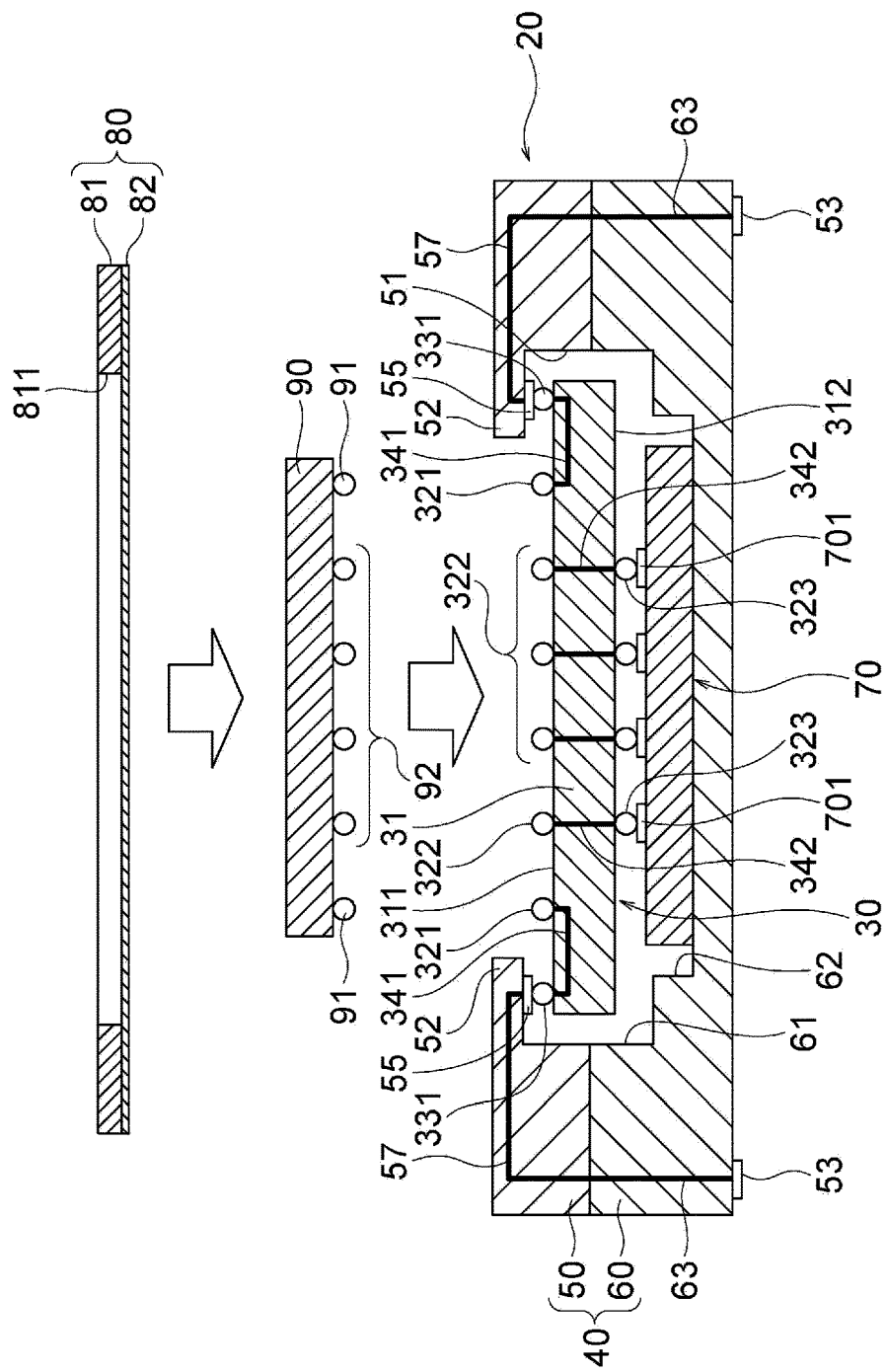
FIG. 4 is an exploded sectional view illustrating a modified example of the test carrier in the first embodiment of the invention.

FIGS. 2 and 3 are an exploded perspective view and an exploded sectional view of the test carrier in the present embodiment, and FIG. 4 is an exploded sectional view illustrating a modified example of the test carrier in the present embodiment.

As illustrated in FIGS. 2 and 3, the test carrier 10 in the present embodiment includes a base member 20 on which the DUT 90 is placed, an electronic device for testing 70 mounted in the base member 20, and a cover member 80 which covers the DUT 90 by being laid on the base member 20. The test carrier 10 holds DUT 90 by interposing the DUT 90 between the base member 20 and the cover member 80.

The test carrier 10 in the present embodiment corresponds to an example of the test carrier in the invention. The base member 20 in the present embodiment corresponds to an example of a base member in the invention, the electronic device for testing 70 according to the present embodiment corresponds to an example of a second electronic device for testing in the invention, and the cover member 80 in the present embodiment corresponds to an example of a cover member in the invention.

The base member 20 includes an interposer 30 and a wiring substrate 40. While the electronic device for testing 70 is permanently mounted on a lower surface 312 of the interposer 30, the DUT 90 is temporarily mounted on an upper surface 311 of the interposer 30 during a test. The interposer 30 is held by the wiring substrate 40.

The interposer 30 in the present embodiment corresponds to an example of an interposer in the invention, and the wiring substrate 40 in the present embodiment corresponds to an example of a wiring substrate in the invention.

For example, the interposer 30 is a silicone (Si)-based interposer. As illustrated in FIG. 3, first and second internal terminals 321 and 322 and a first intermediate terminal 331 are provided on the upper surface 311 of a substrate 31 of the interposer 30.

The first internal terminal 321 is disposed so as to face a first electrode 91 of the DUT 90. On the other hand, the second internal terminal 322 is disposed so as to face a second electrode 92 of the DUT 90. The first intermediate terminal 331 is disposed so as to face a first intermediate terminal 55 which is provided on a protrusion 52 of a first wiring substrate 50.

Meanwhile, a third internal terminal 323 is provided on the lower surface 312 of the substrate 31 of the interposer 30.

The third internal terminal 323 is disposed so as to face a third electrode 701 of the electronic device for testing 70.

Further, first and second internal wirings 341 and 342 are provided in the interposer 30. The first internal wiring 341 is connected to the first internal terminal 321 and the first intermediate terminal 331 of the interposer 30. On the other hand, the second internal wiring 342 penetrates the interposer 30 in a vertical direction, and the second internal wiring 342 is connected to the second internal terminal 322 and the third internal terminal 323 of the interposer 30.

For example, the electronic device for testing 70 is a bare chip in which a memory LSI 71 (see FIG. 6) is formed. The third electrode 701 of the electronic device for testing 70 is joined to the third internal terminal 323 of the interposer 30, and the electronic device for testing 70 is permanently mounted on the lower surface 312 of the interposer 30. The electronic device for testing 70 is not particularly limited as long as the memory LSI 71 is included therein. For example, the electronic device for testing 70 may be a finally packaged memory device.

The number and arrangement of the terminals 321, 322, and 331 on the upper surface 311 of the interposer 30 are not limited to examples illustrated in FIGS. 2 and 3, and may be set according to, for example, the number and arrangement of the electrodes 91 and 92 of the DUT 90. The number and arrangement of the terminal 323 on the lower surface 312 of the interposer 30 are not limited to an example illustrated in FIG. 3, and may be set according to, for example, the number and arrangement of the electrode 701 of the electronic device for testing 70.

The upper surface 311 of the interposer 30 in the present embodiment corresponds to an example of a first main surface of an interposer in the invention, and the lower surface 312 of the interposer 30 in the present embodiment corresponds to an example of a second main surface of the interposer in the invention.

The first electrode 91 in the present embodiment corresponds to an example of a first electrode in the invention, the second electrode 92 in the present embodiment corresponds to an example of a second electrode in the invention, the memory LSI 71 in the present embodiment corresponds to an example of a memory integrated circuit in the invention, and the third electrode 701 in the present embodiment corresponds to an example of a third electrode in the invention.

Further, the first internal terminal 321 in the present embodiment corresponds to an example of a first internal terminal in the invention, the second internal terminal 322 in the present embodiment corresponds to an example of a second internal terminal in the invention, the third internal terminal 323 in the present embodiment corresponds to an example of a third internal terminal in the invention, and the second internal wiring 342 in the present embodiment corresponds to an example of a second wiring in the invention.

The wiring substrate 40 includes the first wiring substrate 50 and a second wiring substrate 60. The first wiring substrate 50 in the present embodiment corresponds to a first wiring substrate in the invention, and the second wiring substrate 60 in the present embodiment corresponds to a second wiring substrate in the invention.

The first wiring substrate 50 is a frame-shaped multi-layer wiring substrate having an opening 51 in the middle thereof. The protrusion 52 is provided on an upper portion of the opening 51 of the first wiring substrate 50. The protrusion 52 protrudes toward an inside of the opening 51. The opening 51 has an internal diameter that allows the interposer 30 to be accommodated therein. On the other hand, a distance between protrusions 52 and 52 is smaller than an external form of the interposer 30.

A first external terminal 53 and the first intermediate terminal 55 are provided on the first wiring substrate 50. The first external terminal 53 is provided near an outer edge on an upper surface of the first wiring substrate 50. On the other hand, the first intermediate terminal 55 is provided on a lower surface of the protrusion 52 of the first wiring substrate 50.

A first internal wiring 57 is provided in the first wiring substrate 50. The first internal wiring 57 connects the first intermediate terminal 55 to the first external terminal 53. The first internal wiring 57 widen a pitch of the first external terminal 53 in comparison with a pitch of the first intermediate terminal 55.

The number and arrangement of the terminals 53 and 55 in the first wiring substrate 50 are not particularly limited to examples illustrated in FIGS. 2 and 3.

The second wiring substrate 60 is a printed circuit board having first and second depressions 61 and 62 which are two steps in the middle. The first depression 61 of the second wiring substrate 60 has an internal diameter which allows the interposer 30 to be accommodated. The second depression 62 is provided in the middle of the first depression 61. The second depression 62 is able to accommodate the electronic device for testing 70, and the internal diameter of the second depression 62 is smaller than the external form of the interposer 30.

As illustrated in FIG. 3, the first wiring substrate 50 and the second wiring substrate 60 are stacked and fixed to each other. In this instance, the electronic device for testing 70 is accommodated in the second depression 62 of the second wiring substrate 60, and the interposer 30 is accommodated in the opening 51 of the first wiring substrate 50 and the first depression 61 of the second wiring substrate 60. For this reason, the interposer 30 and the electronic device for testing 70 are held by being interposed between the first wiring substrate 50 and the second wiring substrate 60. In this state, the first and second internal terminals 321 and 322 of the interposer 30 are exposed upward through the opening 51 of the first wiring substrate 50, and is able to face the electrodes 91 and 92 of the DUT 90.

The first intermediate terminal 331 of the interposer 30 is joined to the first intermediate terminal 55 of the first wiring substrate 50. For this reason, the first internal terminal 321 of the interposer 30 is electrically connected to the first external terminal 53 of the first wiring substrate 50 through the first internal wiring 341 and the first intermediate terminal 331 of the interposer 30 and the first intermediate terminal 55 and the first internal wiring 57 of the first wiring substrate 50.

The opening 51 in the present embodiment corresponds to an example of a first opening in the invention, and the first external terminal 53 in the present embodiment corresponds to an example of a first external terminal in the invention. In the present embodiment, the first internal wiring 341 and the first intermediate terminal 331 of the interposer 30 and the first intermediate terminal 55 and the first internal wiring 57 of the first wiring substrate 50 correspond to an example of a first wiring in the invention.

A location of the first external terminal 53 is not particularly limited. For example, as illustrated in FIG. 4, the first external terminal 53 may be formed on a lower surface of the second wiring substrate 60. In this case, an internal wiring 63 such as a through hole is formed in the second wiring substrate 60, and the first internal wiring 57 is connected to the first external terminal 53 through the internal wiring 63.

In this example illustrated in FIG. 4, the first internal wiring 341 and the first intermediate terminal 331 of the interposer 30, the first intermediate terminal 55 and the first internal wiring 57 of the first wiring substrate 50, and the internal wiring 63 of the second wiring substrate 60 correspond to an example of the first wiring in the invention.

Returning to FIGS. 2 and 3, the cover member 80 includes a cover frame 81 and a cover film 82. The cover frame 81 in the present embodiment corresponds to an example of a frame in the invention, and the cover film 82 in the present embodiment corresponds to an example of a film in the invention.

The cover frame 81 is a frame-shaped rigid substrate having an opening 811 in the middle. For example, the cover frame 81 is made of an insulating material such as polyamide-imide resin, ceramics, and glass. The opening 811 in the present embodiment corresponds to an example of a second opening in the invention.

On the other hand, the cover film 82 is a film made of an elastic material which is flexible and self-adhesive (sticky). Specific examples of a material forming the cover film 82 may include silicone rubber and polyurethane. Herein, the "self-adhesiveness" means the property of being able to stick to another object without using a tackifier, binder or adhesive.

The cover film 82 is glued to a whole surface of the cover frame 81 including the opening 811 by an adhesive (not illustrated). In this way, in the present embodiment, the flexible cover film 82 is glued to the cover frame 81 having a high rigidity, thereby improving handling ability of the cover member 80. The cover member 80 may only include the cover film 82.

The above-described test carrier 10 is assembled as below.

Figure 5:
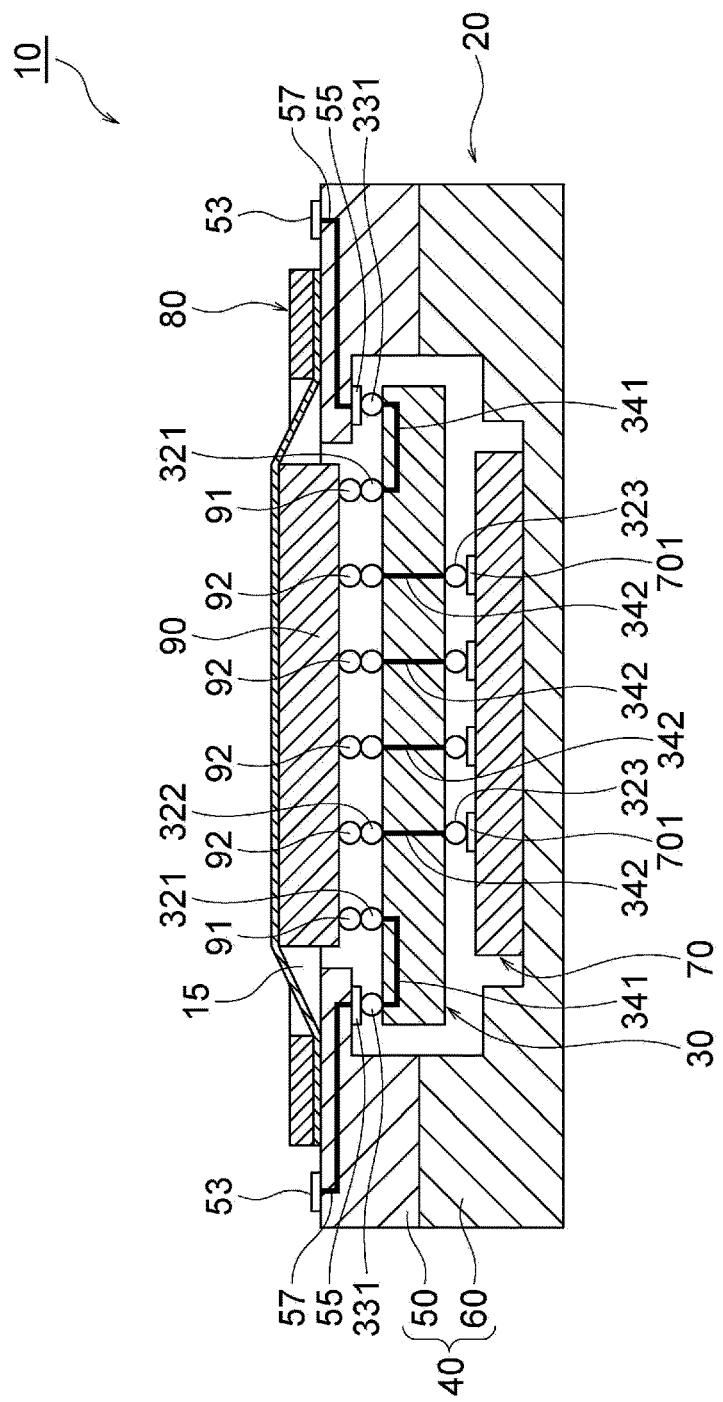
FIG. 5 is a cross-sectional view of a test carrier in an embodiment of the invention.
Figure 6:
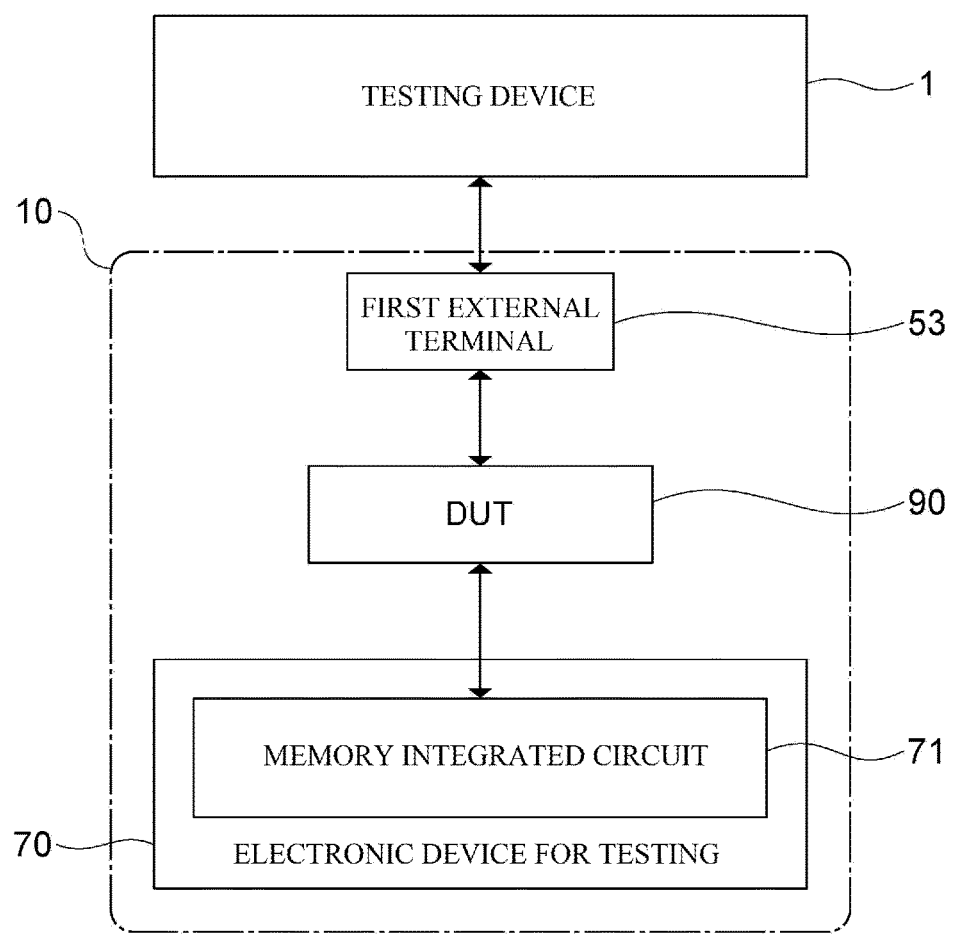
FIG. 6 is a block diagram illustrating an electrical connection relation of the test carrier in the first embodiment of the invention.

FIG. 5 is a cross-sectional view of the test carrier in the present embodiment, and FIG. 6 is a block diagram illustrating an electrical connection relation of the test carrier in the present embodiment.

First, the cover member 80 is reversed, and the DUT 90 is placed on the cover film 82 in a posture in which the first and second electrodes 91 and 92 of the DUT 90 face upward.

In this instance, in the present embodiment, the cover member 80 is self-adhesive as described above, and thus the DUT 90 is able to be temporarily fixed to the cover film 82 by being placed on the cover film 82.

Subsequently, the first and second electrodes 91 and 92 of the DUT 90 are positioned against the first and second internal terminals 321 and 322 of the interposer 30. Then, the base member 20 is placed on top of the cover member 80 in a decompressed environment compared with an atmospheric pressure, and the DUT 90 is interposed between the base member 20 and the cover member 80.

Subsequently, the DUT 90 is held in an accommodation space 15 formed between the base member 20 and the cover member 80 as illustrated in FIG. 5 by putting the test carrier 10 back in an atmospheric pressure environment in a state in which the DUT 90 is interposed between the base member 20 and the cover member 80.

Incidentally, the first and second electrodes 91 and 92 of the DUT 90 are not fixed to the first and second internal terminals 321 and 322 of the interposer 30 by solder or the like. In the present embodiment, as illustrated in FIG. 5, the accommodation space 15 has a negative pressure in comparison with the atmospheric pressure, and thus the DUT 90 is pressed by the cover film 82, and the electrodes 91 and 92 of the DUT 90 come into contact with the internal terminals 321 and 322 of the interposer 30.

The test carrier 10 assembled as described above is conveyed to the testing device 1, and a contactor of the testing device 1 comes into contact with the first external terminal 53 of the test carrier 10. As illustrated in FIGS. 5 and 6, the first external terminal 53 is electrically connected to the DUT 90 through the first internal wiring 57 of the first wiring substrate 50 and the first internal wiring 341 of the interposer 30, and the testing device 1 tests the DUT 90 through the test carrier 10.

In this instance, in the present embodiment, as illustrated in the same figure, the DUT 90 is electrically connected to the electronic device for testing 70 through the second internal wiring 342 of the interposer 30. For this reason, while the test is conducted, the DUT 90 is able to communicate with the memory LSI 71 of the electronic device for testing 70, and it is possible to test the DUT 90 in a similar state to an actual operation.

As described above, in the present embodiment, the test carrier 10 includes the electronic device for testing 70 electrically connected to the DUT 90. Therefore, it is possible to improve quality of a test of the DUT 90 in a similar state to an actual operation.

The embodiment described above has been mentioned to facilitate understanding of the invention, and not to limit the invention. Therefore, each component disclosed in the above embodiment includes all design changes and equivalents within a technical scope of the invention.

Figure 7:
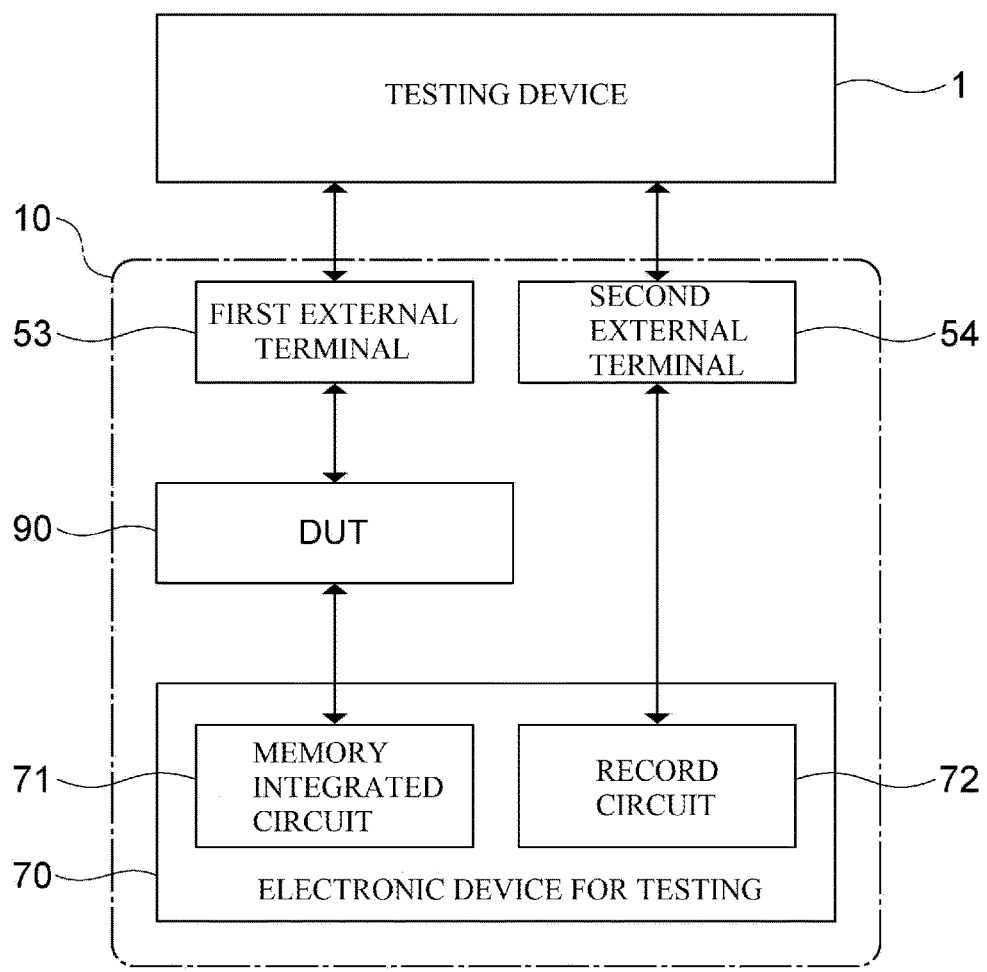
FIG. 7 is a block diagram illustrating an electrical connection relation of a test carrier in a second embodiment of the invention.
Figure 8:
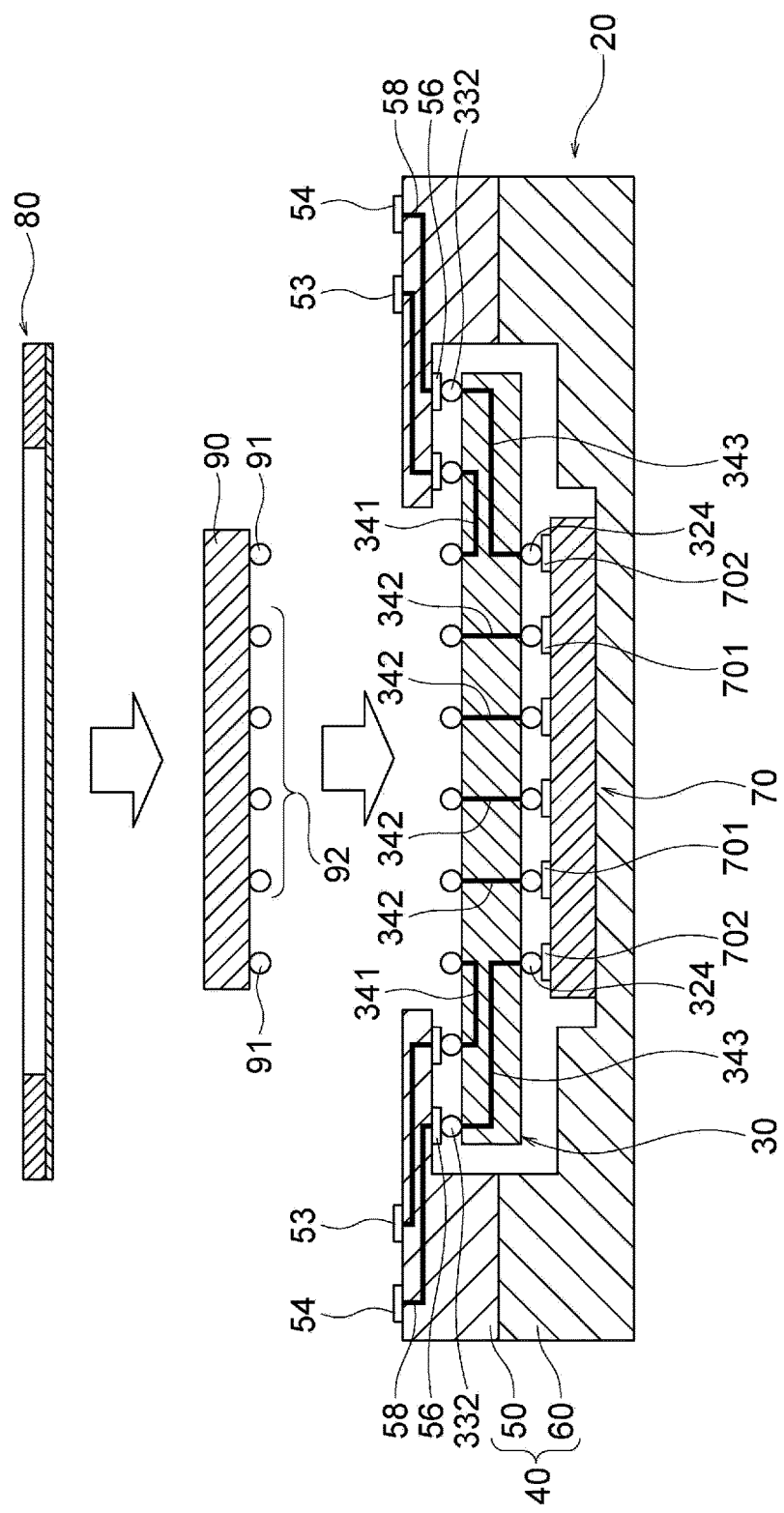
FIG. 8 is an exploded sectional view of the test carrier in the second embodiment of the invention.

FIG. 7 is a block diagram illustrating an electrical connection relation of a test carrier in a second embodiment of the invention, and FIG. 8 is an exploded sectional view of the test carrier in the second embodiment of the invention.

As illustrated in FIG. 7, an electronic device for testing 70 may include a record circuit 72 in addition to a memory LSI 71. The record circuit 72 is a circuit which records communication between a DUT 90 and the memory LSI 71 while the DUT 90 is tested.

In this case, as illustrated in FIG. 8, a fourth internal terminal 324, a third internal wiring 343, and a second intermediate terminal 332 are provided in an interposer 30, and a second intermediate terminal 56, a second internal wiring 58, and a second external terminal 54 are provided in a first wiring substrate 50. The fourth internal terminal 324 of the interposer 30 is joined to a fourth electrode 702 of the electronic device for testing 70. A communication record which is recorded on the record circuit 72 is output to a testing device 1 through the second external terminal 54.

The record circuit 72 in the present embodiment corresponds to an example of a recorder in the invention, the second external terminal 54 in the present embodiment corresponds to an example of a second external terminal in the invention, the fourth internal terminal 324 in the present embodiment corresponds to an example of a fourth internal terminal in the invention, and the fourth electrode 702 in the present embodiment corresponds to an example of a fourth electrode in the invention. In the present embodiment, the third internal wiring 343 and the second intermediate terminal 332 of the interposer 30, and the second intermediate terminal 56 and the second internal wiring 58 of the first wiring substrate 50 correspond to an example of a third wiring in the invention.

Figure 9:
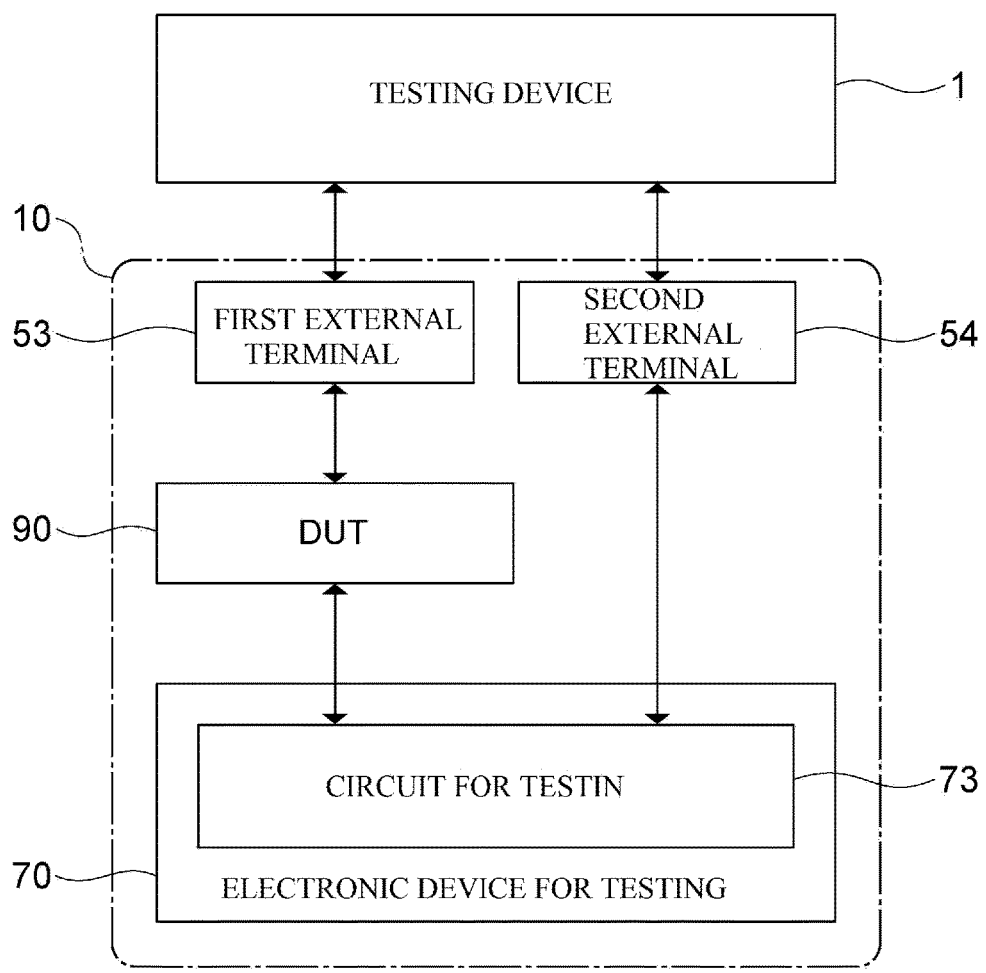
FIG. 9 is a block diagram illustrating an electrical connection relation of a test carrier in a third embodiment of the invention.

FIG. 9 is a block diagram illustrating an electrical connection relation of a test carrier in a third embodiment of the invention.

As illustrated in FIG. 9, an electronic device for testing 70 may include a circuit for testing 73 used to test a DUT 90 instead of a memory LSI. Specific examples of the circuit for testing 73 may include a built-in self test (BIST) circuit for the DUT 90.

In this case, similarly to an example illustrated in FIG. 7, a fourth internal terminal 324, a third internal wiring 343, and a second intermediate terminal 332 are provided in an interposer 30, and a second intermediate terminal 56, a second internal wiring 58, and a second external terminal 54 are provided in a first wiring substrate 50 as illustrated in FIG. 8. The fourth internal terminal 324 of the interposer 30 is joined to a fourth electrode 702 of the electronic device for testing 70.

The circuit for testing 73 may be a BIST circuit in a complementary relation with a BIST circuit formed in a logic LSI of the DUT 90. Alternatively, the circuit for testing 73 may be a tester chip which tests the DUT 90. The electronic device for testing 70 may include a memory LSI 71 in addition to the circuit for testing 73.

The circuit for testing 73 in the present embodiment corresponds to an example of a circuit for testing in the invention, the second external terminal 54 in the present embodiment corresponds to an example of the second external terminal in the invention, the fourth internal terminal 324 in the present embodiment corresponds to an example of the fourth internal terminal in the invention, and the fourth electrode 702 in the present embodiment corresponds to an example of the fourth electrode in the invention. In the present embodiment, the third internal wiring 343 and the second intermediate terminal 332 of the interposer 30, and the second intermediate terminal 56 and the second internal wiring 58 of the first wiring substrate 50 correspond to an example of the third wiring in the invention.

EXPLANATIONS OF LETTERS OR NUMERALS

1 Testing device
10 Test carrier
15 Accommodation space
20 Base member
30 Interposer
31 Substrate
311 Upper surface
312 Lower surface
321 to 324 First to fourth internal terminals
331 and 332 First and second intermediate terminals
341 to 343 First to third internal wirings
40 Wiring substrate
50 First wiring substrate
51 Opening
52 Protrusion
53 and 54 First and second external terminals
55 and 56 First and second intermediate terminals
57 and 58 First and second internal wirings
60 Second wiring substrate
61 First depression
62 Second depression
63 Internal wiring
70 Electronic device for testing
701 and 702 Third and fourth electrodes
71 Memory integrated circuit
72 Storage circuit
73 BIST circuit
80 Cover member
81 Cover frame
811 Opening
82 Cover film
90 DUT
91 and 92 First and second electrodes

What is claimed is:

1. A test carrier comprising:
a base member on which a first electronic device under test is configured to be temporarily mounted; and
a second electronic device that is configured to be used to test the first electronic device, wherein
the second electronic device is mounted on the base member,
the second electronic device is configured to be electrically connected to the first electronic device,
the base member includes:
a first external terminal of the test carrier;
a first wiring that is configured to electrically connect the first electronic device to the first external terminal;
a second wiring that is configured to electrically connect the first electronic device to the second electronic device;
an interposer on which the second electronic device is mounted; and
a wiring substrate on which the first external terminal is provided and which holds the interposer,
the interposer includes:
a first main surface on which first and second internal terminals are provided, the first and second internal terminals being configured to contact first and second electrodes of the first electronic device; and
a second main surface on which a third internal terminal is provided, the third internal terminal being joined to a third electrode of the second electronic device,
the first wiring is provided in the interposer and the wiring substrate so as to electrically connect the first internal terminal to the first external terminal, and
the second wiring is provided in the interposer so as to electrically connect the second internal terminal to the third internal terminal.

2. The test carrier according to claim 1, wherein
the wiring substrate includes:
a first wiring substrate which includes a first opening; and
a second wiring substrate on which the first wiring substrate is stacked,
the interposer and the second electronic device are interposed between the first wiring substrate and the second wiring substrate, and
the first and second internal terminals of the interposer are configured to face the first electronic device through the first opening.

3. The test carrier according to claim 2, further comprising a cover member which is laid on the base member so as to cover the first electronic device, wherein
the first electronic device is interposed between the base member and the cover member of the test carrier,
the cover member includes:
a film which covers the first electronic device; and
a frame which includes a second opening and to which the film is attached,
an accommodation space is provided between the base member and the cover member to accommodate the first electronic device, and
the accommodation space is decompressed relative to ambient air.

4. A test carrier comprising:
a base member on which a first electronic device under test is configured to be temporarily mounted; and
a second electronic device that is configured to be used to test the first electronic device, wherein the second electronic device is mounted within the base member,
the second electronic device is configured to be electrically connected to the first electronic device,
the base member includes:
a first external terminal of the test carrier;
a first wiring that is configured to electrically connect the first electronic device to the first external terminal;
a second wiring that is configured to electrically connect the first electronic device to the second electronic device;
an interposer on which the second electronic device is mounted; and
a wiring substrate on which the first external terminal is provided and which holds the interposer,
the interposer includes:
a first main surface on which first and second internal terminals are provided, the first and second internal terminals being configured to contact first and second electrodes of the first electronic device; and
a second main surface on which a third internal terminal is provided, the third internal terminal being joined to a third electrode of the second electronic device,
the first wiring is provided in the interposer and the wiring substrate so as to electrically connect the first internal terminal to the first external terminal, and
the second wiring is provided in the interposer so as to electrically connect the second internal terminal to the third internal terminal.

5. The test carrier according to claim 4, wherein
the wiring substrate includes:
a first wiring substrate which includes a first opening; and
a second wiring substrate on which the first wiring substrate is stacked,
the interposer and the second electronic device are interposed between the first wiring substrate and the second wiring substrate, and
the first and second internal terminals of the interposer are configured to face the first electronic device through the first opening.

6. The test carrier according to claim 5, further comprising a cover member which is laid on the base member so as to cover the first electronic device, wherein
the first electronic device is interposed between the base member and the cover member of the test carrier,
the cover member includes:
a film which covers the first electronic device; and
a frame which includes a second opening and to which the film is attached,
an accommodation space is provided between the base member and the cover member to accommodate the first electronic device, and
the accommodation space is decompressed relative to ambient air.

* * * * *